(12) United States Patent
Lee et al.

(10) Patent No.: US 7,816,705 B2
(45) Date of Patent: Oct. 19, 2010

(54) METHOD OF FABRICATING VERTICAL STRUCTURE LEDS

(75) Inventors: Jong-Lam Lee, Kyungbuk (KR);
In-Kwon Jeong, Cupertino, CA (US);
Myung Cheol Yoo, Pleasant, CA (US)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/458,703

(22) Filed: Jul. 21, 2009

(65) Prior Publication Data

US 2009/0278161 A1    Nov. 12, 2009

Related U.S. Application Data

(60) Continuation of application No. 11/002,413, filed on Dec. 3, 2004, now Pat. No. 7,569,865, which is a division of application No. 10/118,316, filed on Apr. 9, 2002, now abandoned.

(51) Int. Cl.
*H01L 33/00* (2010.01)
(52) U.S. Cl. .......................... 257/99; 257/79; 257/103; 257/E33.025
(58) Field of Classification Search ................ 257/99, 257/79, 103, E33.025
See application file for complete search history.

(56) References Cited

U.S. PATENT DOCUMENTS

| | | | |
|---|---|---|---|
| 3,602,982 A | 9/1971 | Kooi | |
| 4,141,135 A | 2/1979 | Henry et al. | |
| 4,406,052 A | 9/1983 | Cogan | |
| 5,034,068 A | 7/1991 | Glenn et al. | |
| 5,040,044 A | 8/1991 | Noguchi et al. | |
| 5,504,036 A | 4/1996 | Dekker et al. | |
| 5,661,074 A | 8/1997 | Tischler | |
| 5,739,554 A | 4/1998 | Edmong et al. | |
| 5,874,747 A | 2/1999 | Redwing et al. | |
| 5,929,466 A | 7/1999 | Ohba et al. | |

(Continued)

FOREIGN PATENT DOCUMENTS

DE    100 22 879 A1    12/2000

(Continued)

OTHER PUBLICATIONS

M.K. Kelly, et al., Optical Process for Liftoff of Group III-nitride Films, Physica Status Solidi (a) vol. 159, 1997, pp. R3-R4.

(Continued)

*Primary Examiner*—Victor A Mandala
(74) *Attorney, Agent, or Firm*—McKenna Long & Aldridge LLP

(57) ABSTRACT

A method of fabricating semiconductor devices, such as GaN LEDs, on insulating substrates, such as sapphire. Semiconductor layers are produced on the insulating substrate using normal semiconductor processing techniques. Trenches that define the boundaries of the individual devices are then formed through the semiconductor layers and into the insulating substrate, beneficially by using inductive coupled plasma reactive ion etching. The trenches are then filled with an easily removed layer. A metal support structure is then formed on the semiconductor layers (such as by plating or by deposition) and the insulating substrate is removed. Electrical contacts, a passivation layer, and metallic pads are then added to the individual devices, and the individual devices are then diced out.

78 Claims, 7 Drawing Sheets

U.S. PATENT DOCUMENTS

| | | | |
|---|---|---|---|
| 5,959,307 A * | 9/1999 | Nakamura et al. ............ 257/14 |
| 5,972,781 A | 10/1999 | Wegleiter |
| 6,066,861 A | 5/2000 | Hohn et al. |
| 6,067,309 A | 5/2000 | Onomura et al. |
| 6,071,795 A | 6/2000 | Cheung et al. |
| 6,100,104 A | 8/2000 | Haerle |
| 6,100,545 A | 8/2000 | Chiyo et al. |
| 6,120,600 A | 9/2000 | Edmond et al. |
| 6,172,382 B1 | 1/2001 | Nagahama et al. |
| 6,281,526 B1 * | 8/2001 | Nitta et al. ................ 257/103 |
| 6,303,405 B1 | 10/2001 | Yoshida et al. |
| 6,320,206 B1 | 11/2001 | Coman et al. |
| 6,326,294 B1 | 12/2001 | Jang et al. |
| 6,329,216 B1 | 12/2001 | Matsumoto et al. |
| 6,335,217 B1 | 1/2002 | Chiyo et al. |
| 6,339,010 B2 | 1/2002 | Sameshima |
| 6,350,998 B1 | 2/2002 | Tsuji |
| 6,358,770 B2 | 3/2002 | Itoh et al. |
| 6,365,429 B1 | 4/2002 | Kneissi et al. |
| 6,426,512 B1 | 7/2002 | Ito et al. |
| 6,479,839 B2 | 11/2002 | Nikolaev et al. |
| 6,510,195 B1 | 1/2003 | Chappo et al. |
| 6,555,405 B2 | 4/2003 | Chen et al. |
| 6,614,060 B1 | 9/2003 | Wang et al. |
| 6,624,491 B2 | 9/2003 | Waitl et al. |
| 6,639,925 B2 | 10/2003 | Niwa et al. |
| 6,677,173 B2 * | 1/2004 | Ota ............................ 438/22 |
| 6,711,192 B1 | 3/2004 | Chikuma et al. |
| 6,744,071 B2 | 6/2004 | Sano et al. |
| 6,744,196 B1 | 6/2004 | Jeon |
| 6,746,889 B1 | 6/2004 | Eliashevich et al. |
| 6,765,232 B2 | 7/2004 | Takahashi et al. |
| 6,784,463 B2 | 8/2004 | Camras et al. |
| 6,803,603 B1 | 10/2004 | Nitta et al. |
| 6,818,531 B1 | 11/2004 | Yoo et al. |
| 6,846,686 B2 | 1/2005 | Saeki et al. |
| 6,869,820 B2 | 3/2005 | Chen |
| 6,960,488 B2 | 11/2005 | Brosnihan et al. |
| 7,148,520 B2 | 12/2006 | Yoo |
| 7,250,638 B2 | 7/2007 | Lee et al. |
| 2001/0014391 A1 | 8/2001 | Forrest et al. |
| 2001/0019134 A1 | 9/2001 | Chang et al. |
| 2001/0042866 A1 | 11/2001 | Coman et al. |
| 2002/0137244 A1 | 9/2002 | Chen et al. |
| 2002/0163302 A1 | 11/2002 | Nitta et al. |
| 2004/0033638 A1 | 2/2004 | Bader |
| 2004/0051105 A1 | 3/2004 | Tsuda et al. |
| 2004/0259279 A1 | 12/2004 | Erchak et al. |
| 2006/0027831 A1 | 2/2006 | Kioke et al. |
| 2006/0060866 A1 | 3/2006 | Tezen |
| 2006/0175681 A1 | 8/2006 | Li |
| 2006/0289886 A1 | 12/2006 | Sakai |
| 2007/0020790 A1 | 1/2007 | Erchak et al. |
| 2007/0048885 A1 | 3/2007 | Jeon |
| 2007/0122994 A1 | 5/2007 | Sonobe et al. |

FOREIGN PATENT DOCUMENTS

| | | |
|---|---|---|
| JP | 6-302857 | 10/1994 |
| JP | 11-074560 | 3/1999 |
| JP | 11-168236 | 6/1999 |
| JP | 11-238913 | 8/1999 |
| JP | 2000-101139 | 4/2000 |
| JP | 2000323797 | 11/2000 |
| JP | 2001339100 | 12/2001 |
| KR | 1020020000141 | 1/2002 |
| WO | WO 01/82384 | 11/2001 |

OTHER PUBLICATIONS

Wong et al, Integration of InGaN Laser Diodes with Dissimilar Substrates by Laser Lift-Off, 2001, Materials Research Society, pp. 12.2.1-12.2.5.

Michael Kneissl, et al., "Continuous-Wave Operation of InGaN Multiple-Quantum-Well Laser Diodes on Copper Substrates Obtained by Laser Liftoff", IEEE Journal on Selected Topics in Quantum Electronics, vol. 7, No. 2, Mar./Apr. 2001; pp. 188-191.

William S. Wong, et al., "Continuous-Wave InGaN Multiple-Quantum-Well Laser Diodes on Copper Substrates", Applied Physics Letters vol. 78, No. 9, Feb. 26, 2001; pp. 1198-1200.

William S. Wong, et al., "The integration of $In_xGa_{1-x}N$ Multiple-Quantum-Well Laser Diodes with Copper Substrates by Laser Lift-Off", Jpn. J. Appl. Phys. vol. 39 (2000) pp. L 1203-L 1205, Part 2, No. 12A, Dec. 1, 2000; pp. L1203-L1205.

Song Y-K, et al, "A Vertical Injection Blue Light Emitting Diode in Substrate Separated InGaN Heterostructures," vol. 74, published Jun. 14, 1999, pp. 3720-3722.

* cited by examiner

METHOD OF FABRICATING VERTICAL STRUCTURE LEDS

This application is a continuation of prior application Ser. No. 11/002,413, filed Dec. 3, 2004 now U.S. Pat. No. 7,569,865 which is a divisional of prior application Ser. No. 10/118,316, filed Apr. 9, 2002 now abandoned.

BACKGROUND OF THE INVENTION

1. Field of the Invention

The present invention relates to semiconductor device fabrication. More particularly, the present invention relates to a method of fabricating vertical devices using a metal support layer.

2. Discussion of the Related Art

Light emitting diodes ("LEDs") are well-known semiconductor devices that convert electrical current into light. The color (wavelength) of the light that is emitted by an LED depends on the semiconductor material that is used to fabricate the LED. This is because the wavelength of the emitted light depends on the semiconductor material's band-gap, which represents the energy difference between the material's valence band and conduction band electrons.

Gallium-Nitride (GaN) has gained much attention from LED researchers. One reason for this is that GaN can be combined with indium to produce InGaN/GaN semiconductor layers that emit green, blue, and white light. This wavelength control ability enables an LED semiconductor designer to tailor material characteristics to achieve beneficial device characteristics. For example, GaN enables an LED semiconductor designer to produce blue LEDs, which are beneficial in optical recordings, and white LEDs, which can replace incandescent lamps.

Because of the foregoing and other advantageous, the market for GaN-based LEDs is rapidly growing. Accordingly, GaN-based opto-electronic device technology has rapidly evolved since their commercial introduction in 1994. Because the efficiency of GaN light emitting diodes has surpassed that of incandescent lighting, and is now comparable with that of fluorescent lighting, the market for GaN based LEDs is expected to continue its rapid growth.

Despite the rapid development of GaN device technology, GaN devices are too expensive for many applications. One reason for this is the high cost of manufacturing GaN-based devices, which in turn is related to the difficulties of growing GaN epitaxial layers and of subsequently dicing out completed GaN-based devices.

GaN-based devices are typically fabricated on sapphire substrates. This is because sapphire wafers are commercially available in dimensions that are suitable for mass-producing GaN-based devices, because sapphire supports relatively high-quality GaN epitaxial layer growths, and because of the extensive temperature handling capability of sapphire.

Typically, GaN-based devices are fabricated on 2" diameter sapphire wafers that are either 330 or 430 microns thick. Such a diameter enables the fabrication of thousands of individual devices, while the thickness is sufficient to support device fabrication without excessive wafer warping. Furthermore, sapphire is chemically and thermally stable, has a high melting temperature that enables high temperature fabrication processes, has a high bonding energy (122.4 Kcal/mole), and a high dielectric constant. Chemically, sapphires are crystalline aluminum oxide, $Al_2O_3$.

Fabricating semiconductor devices on sapphire is typically performed by growing an n-GaN epitaxial layer on a sapphire substrate using metal oxide chemical vapor deposition (MOCVD) or molecular beam epitaxy (MBE). Then, a plurality of individual devices, such as GaN LEDs, is fabricated on the epitaxial layer using normal semiconductor processing techniques. After the individual devices are fabricated they must be diced out (separated) of the sapphire substrate. However, since sapphires are extremely hard, are chemically resistant, and do not have natural cleave angles, sapphire substrates are difficult to dice. Indeed, dicing typically requires that the sapphire substrate be thinned to about 100 microns by mechanical grinding, lapping, and/or polishing. It should be noted that such mechanical steps are time consuming and expensive, and that such steps reduce device yields. Even after thinning sapphires remain difficult to dice. Thus, after thinning and polishing, the sapphire substrate is usually attached to a supporting tape. Then, a diamond saw or stylus forms scribe lines between the individual devices. Such scribing typically requires at least half an hour to process one substrate, adding even more to the manufacturing costs. Additionally, since the scribe lines have to be relatively wide to enable subsequent dicing, the device yields are reduced, adding even more to manufacturing costs. After scribing, the sapphire substrates can be rolled using a rubber roller or struck with a knife-edge to produce stress cracks that can be used to dice out the individual semiconductor devices. Such mechanical handling reduces yields even more.

Of note, because sapphire is an insulator the LED device topologies that are available when using sapphire substrates (or other insulating substrates) are, in practice, limited to lateral and vertical topologies. In the lateral topology the metallic electrical contacts that are used to inject electrical current into the LED are both located on upper surfaces (or on the same side of the substrate). In the vertical topology one metallic contact is on an upper surface, the sapphire (insulating) substrate is removed, and the other contact is located on a lower surface.

FIGS. 1A and 1B illustrate a typical lateral GaN-based LED 20 that is fabricated on a sapphire substrate 22. Referring now specifically to FIG. 1A, an n-GaN buffer layer 24 is formed on the substrate 22. A relatively thick n-GaN layer 26 is formed on the buffer layer 24. An active layer 28 having multiple quantum wells of aluminum-indium-gallium-nitride (AlInGaN) or of InGaN/GaN is then formed on the n-type GaN layer 26. A p-GaN layer 30 is then formed on the active layer 26. A transparent conductive layer 32 is then formed on the p-GaN layer 30. The transparent conductive layer 32 may be made of any suitable material, such as Ru/Au, Ni/Au or indium-tin-oxide (ITO). A p-type electrode 34 is then formed on one side of the transparent conductive layer 32. Suitable p-type electrode materials include Ni/Au, Pd/Au, Pd/Ni and Pt. A pad 36 is then formed on the p-type electrode 34. Beneficially, the pad 36 is Au. The transparent conductive layer 32, the p-GaN layer 30, the active layer 28 and part of the n-GaN layer 26 are etched to form a step. Because of the difficulty of wet etching GaN, a dry etch is usually used. This etching requires additional lithography and stripping processes. Furthermore, plasma damage to the GaN step surface is often sustained during the dry-etch process. The LED 20 is completed by forming an n-electrode pad 38 (usually Au) and a pad 40 on the step.

FIG. 1B illustrates a top down view of the LED 20. As can be seen, lateral GaN-based LEDs have a significant draw back in that having both metal contacts (36 and 40) on the same side of the LED significantly reduces the surface area available for light emission. As shown in FIG. 1B the metal contacts 36 and 40 are physically close together. Furthermore, as previously mentioned the pads 36 are often Au. When external wire bonds are attached to the pads 36 and 40, the Au often spreads. Au spreading can bring the electrical contacts even closer together. Such closely spaced electrodes 34 are highly susceptible to ESD damage.

FIGS. 2A and 2B illustrate a vertical GaN-based LED 50 that was formed on a sapphire substrate that was subsequently removed. Referring now specifically to FIG. 2A, the LED 50 includes a GaN buffer layer 54 having an n-metal contact 56 on a bottom side, and a relatively thick n-GaN layer 58 on the other. The n-metal contact 56 is beneficially formed from a high reflectively layer that is overlaid by a high conductivity metal, including, for example, Au. An active layer 60 having multiple quantum wells is formed on the n-type GaN layer 58, and a p-GaN layer 62 is formed on the active layer 60. A transparent conductive layer 64 is then formed on the p-GaN layer 62, and a p-type electrode 66 is formed on the transparent conductive layer 64. A pad 68 is formed on the p-type electrode 66. The materials for the various layers are similar to those used in the lateral LED 20. The vertical GaN-based LED 50 as the advantage that etching a step is not required. However, to locate the n-metal contact 56 below the GaN buffer layer 54 the sapphire substrate (not shown) has to be removed. Such removal can be difficult, particularly if device yields are of concern. However, as discussed subsequently, sapphire substrate removal using laser lift off is known.

Referring now to FIG. 2B, vertical GaN-based LEDs have the advantage that only one metal contact (68) blocks light. Thus, to provide the same amount of light emission area, lateral GaN-based LEDs must have a larger surface area, which lowers device yields. Furthermore, the reflecting layer of the n-type contact 56 of vertical GaN-based LEDs reflect light that is otherwise absorbed in lateral GaN-based LEDs. Thus, to emit the same amount of light as a vertical GaN-based LED, a lateral GaN-based LED must have a significantly larger surface area. Because of these issues, a 2" diameter sapphire wafer can produce about 35,000 vertical GaN-based LEDs, but only about 12,000 lateral GaN-based LEDs. Furthermore, the lateral topology is more vulnerable to static electricity, primarily because the two electrodes (36 and 40) are so close together. Additionally, as the lateral topology is fabricated on an insulating substrate, and as the vertical topology can be attached to a heat sink, the lateral topology has relatively poor thermal dissipation. Thus, in many respects the vertical topology is operationally superior to the lateral topology.

However, most GaN-based LEDs fabricated with a lateral topology. This is primarily because of the difficulties of removing the insulating substrate and of handling the GaN wafer structure without a supporting substrate. Despite these problems, removal of an insulation (growth) substrate and subsequent wafer bonding of the resulting GaN-based wafer on a Si substrate using Pd/In metal layers has been demonstrated for very small area wafers, approx. 1 cm by 1 cm. But, substrate removal and subsequent wafer bonding of large area wafers remains very difficult due to inhomogeneous bonding between the GaN wafer and the $2^{nd}$ (substitutional) substrate. This is mainly due to wafer bowing during and after laser lift off.

Thus, it is apparent that a new method of fabricating vertical topology devices would be beneficial. In particular, a method that provides for mechanical stability of semiconductor wafer layers, that enables vertical topology electrical contact formation, and that improves heat dissipation would be highly useful, particularly with devices subject to high electrical currents, such as laser diodes or high-power LEDs. Beneficially, such a method would enable forming multiple semiconductor layers on an insulating substrate, the adding of a top support metal layer that provides for top electrical contacts and for structural stability, and the removal of the insulating substrate. Of particular benefit would be a new method of forming partially fabricated semiconductor devices on a sapphire (or other insulating) substrate, the adding of a top support metal layer over the partially fabricated semiconductor layers, the removal of the sapphire (or other insulating) substrate, the formation of bottom electrical contacts, and the dicing of the top support metal layer to yield a plurality of devices. Specifically advantageous would be fabrication process that produces vertical topology GaN-based LEDs.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

The principles of the present invention provide for a method of fabricating semiconductor devices on insulating substrates by first forming semiconductor layers on the insulating substrate, followed by forming a metal layer over the semiconductor layers, followed by removal of the insulating substrate to isolate a structurally supported wafer comprised of the formed semiconductor layers and the metal layer. The metal layer supports the semiconductor layers to prevent warping and/or other damage and provides for electrical contacts. Beneficially, the metal layer includes a metal, such as Cu, Cr, Ni, Au, Ag, Mo, Pt, Pd, W, or Al, or a metal containing material such as titanium nitride. Forming of the metal layer can be performed in numerous ways, for example, by electroplating, by electro-less plating, by CVD, or by sputtering. Subsequently, bottom electrical contacts can be added to the semiconductor layers and then individual semiconductor devices can be diced from the resulting structure.

The principles of the present invention further provide for a method of fabricating vertical topology GaN-based devices on an insulating substrate by the use of a metal support film and by the subsequent removal of the insulating substrate. According to that method, semiconductor layers for the GaN-based devices are formed on an insulating (sapphire) substrate using normal semiconductor fabrication techniques. Then, trenches that define the boundaries of the individual devices are formed through the semiconductor layers. Those trenches may also be formed into the insulating substrate. Trench forming is beneficially performed using inductive coupled plasma reactive ion etching (ICPRIE). The trenches are then filled with an easily removed layer (such as a photoresist). A metal support structure is then formed on the semiconductor layers. Beneficially, the metal support structure includes a metal, such as Cu, Cr, Ni, Au, Ag, Mo, Pt, Pd, W, or Al, or a metal-containing material such as titanium nitride. Forming of the metal support structure can be performed in numerous ways, for example, by electroplating, by electro-less plating, by CVD, or by sputtering. The insulating substrate is then removed, beneficially using a laser-lift off process. Electrical contacts, a passivation layer, and metallic pads are then added to the individual devices, and the individual devices are then diced out.

The principles of the present invention specifically provide for a method of fabricating vertical topology GaN-based LEDs on sapphire substrates. According to that method, semiconductor layers for the vertical topology GaN-based LEDs are formed on a sapphire substrate using normal semiconductor fabrication techniques. Then, trenches that define the boundaries of the individual vertical topology GaN-based LEDs are formed through the semiconductor layers. Those trenches may also be formed into the sapphire substrate. Trench forming is beneficially performed using inductive coupled plasma reactive ion etching (ICPRIE). Beneficially, the trenches are fabricated using ICPRIE. The trenches are then beneficially filled with an easily removed layer (such as a photo-resist). A metal support structure is then formed on the semiconductor layers. Beneficially, the metal support structure includes a metal, such as Cu, Cr, Ni, Au, Ag, Mo, Pt, Pd, W, or Al, or a metal-containing material such as titanium nitride. Forming of the metal layer can be performed in numerous ways, for example, by electroplating, by electroless plating, by CVD, or by sputtering. The sapphire substrate is then removed, beneficially using a laser-lift off process. Electrical contacts, a passivation layer, and metallic pads are then added to the individual LEDs, and the individual LEDs are then diced out.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

In the drawings.

DETAILED DESCRIPTION OF THE ILLUSTRATED EMBODIMENTS

The principles of the present invention provide for methods of fabricating semiconductor devices, such as GaN-based vertical topology LEDs, on insulating substrates, such as sapphire substrates, using metal support films. While those principles are illustrated in a detailed description of a method of fabricating vertical topology GaN-based LEDs on a sapphire substrate, those principles are broader than that illustrated method. Therefore, the principles of the present invention are to be limited only by the appended claims as understood under United States Patent Laws.

FIGS. 3-15 illustrate a method of manufacturing vertical topology GaN-based light emitting diodes (LEDs) on sapphire substrates. Sapphire substrates are readily available in suitable sizes, are thermally, chemically, and mechanically stable, are relatively inexpensive, and support the growth of good quality GaN epitaxial layers. It should be understood that those figures are not to scale.

Figure 1A:
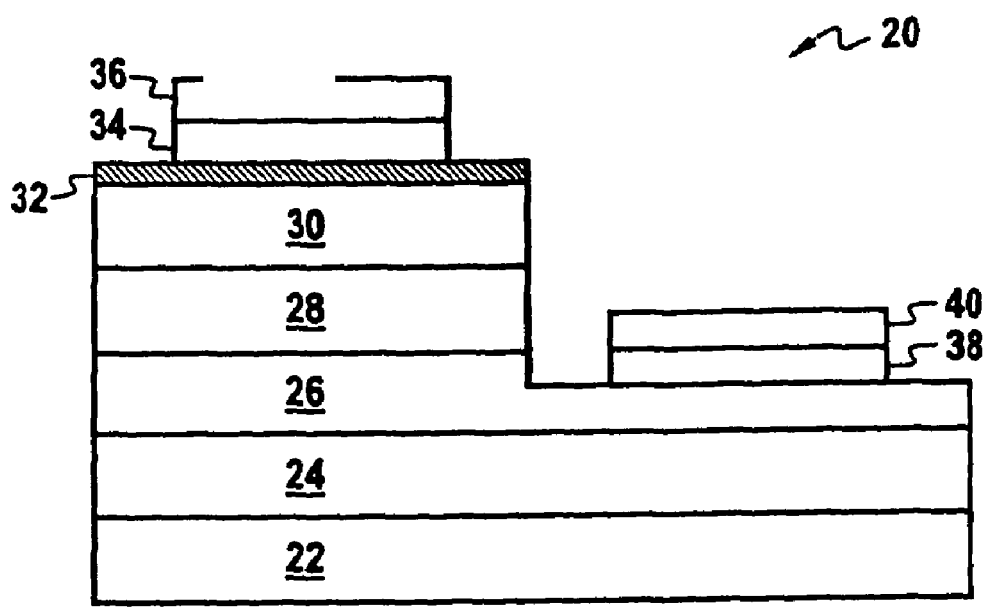
FIG. 1A illustrates a sectional view of a typical lateral topology GaN-based LED.
Figure 1B:
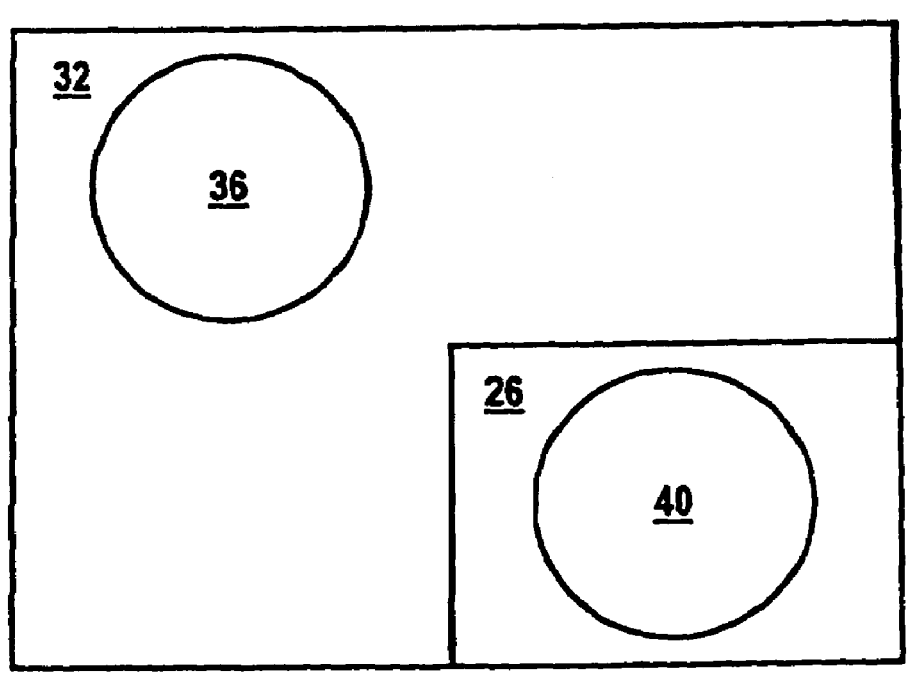
FIG. 1B shows a top down view of the GaN-based LED illustrated in FIG. 1A.
Figure 2A:
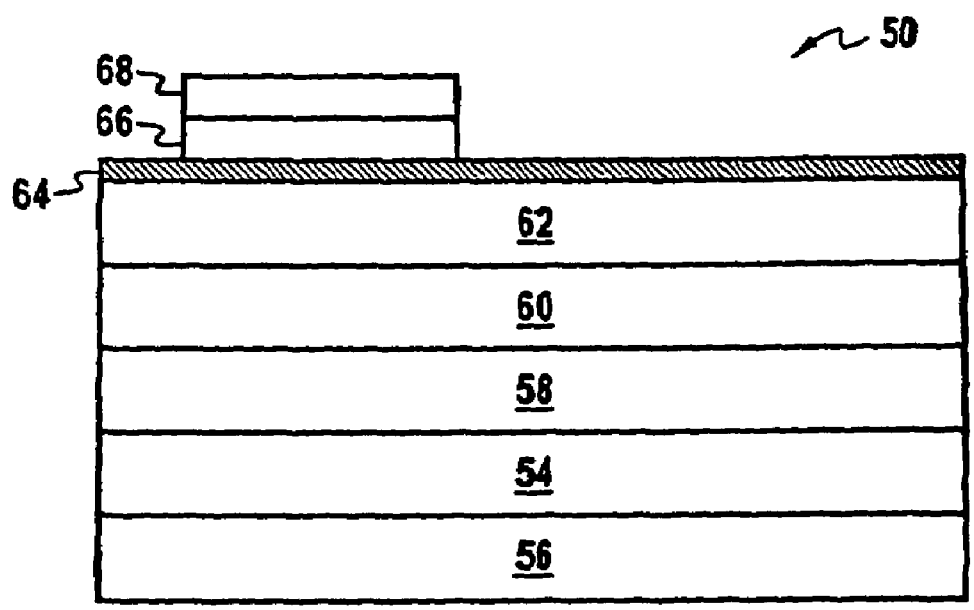
FIG. 2A illustrates a sectional view of a typical vertical topology GaN-based LED.
Figure 2B:
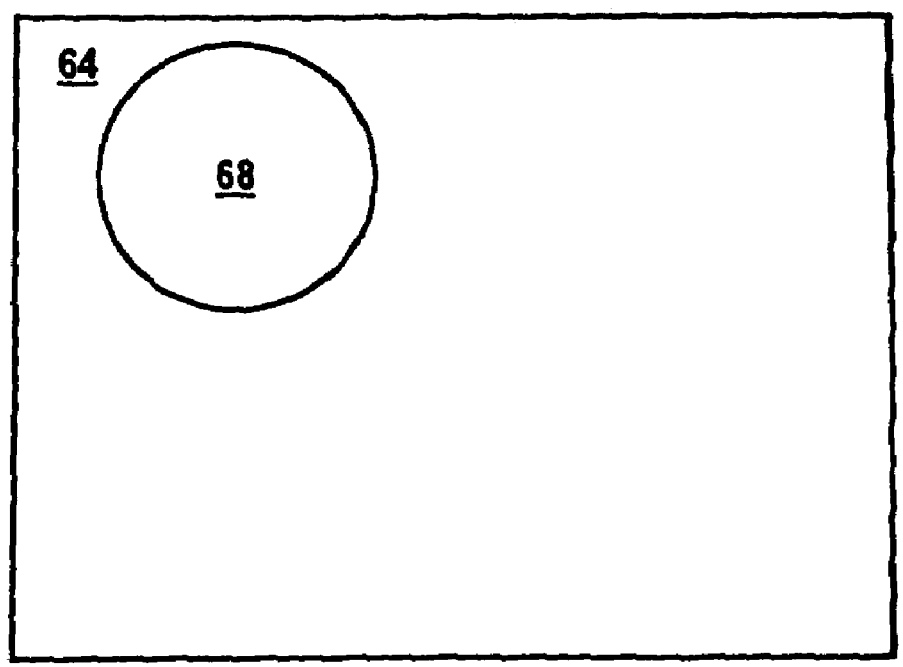
FIG. 2B shows a top down view of the GaN-based LED illustrated in FIG. 2A.
Figure 3:
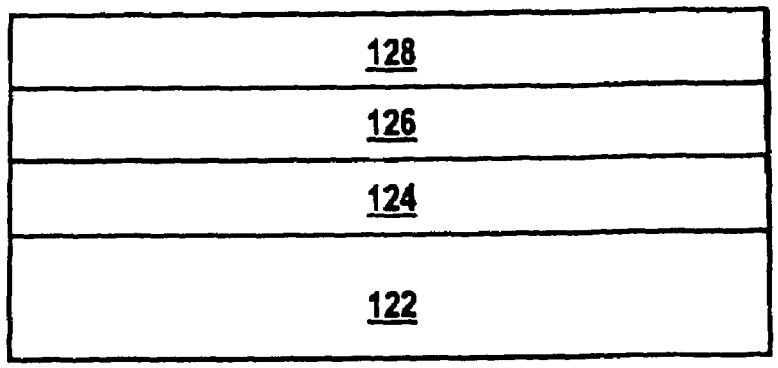
FIGS. 3-15 illustrate steps of forming a light emitting diode that are in accord with the principles of the present invention.

Referring now to FIG. 3, initially a GaN-based LED layer structure is formed on a 330-430 micron-thick, 2" diameter (0001) sapphire substrate 122. The GaN-based LED layer structure includes an n-GaN buffer layer 124, an InGaN/GaN active layer 126 (beneficially having the proper composition to emit blue light) on the buffer layer 124, and a p-GaN contact layer 128 on the active layer 126.

Still referring to FIG. 3, the buffer layer 124 beneficially includes both a 2 µm undoped GaN layer formed directly on the substrate, and a 1 µm thick, n-type, silicon doped, GaN layer. The p-GaN contact layer 128 is beneficially about 0.05 µm thick and is doped with Mg. Overall, the GaN-based LED layer structure is beneficially less than about 5 microns thick. Various standard epitaxial growth techniques, such as vapor phase epitaxy, MOCVD, and MBE, together with suitable dopants and other materials, can be used to produce the GaN-based LED layer structure.

Figure 4:
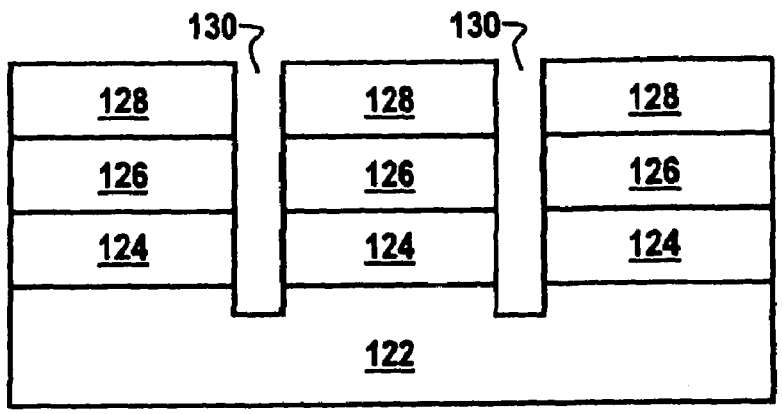

Referring now to FIG. 4, trenches 130 are formed through the vertical topology GaN-based LED layer structure. Those trenches 130 may extend into the sapphire substrate 122. The trenches 130 define the individual LED semiconductor structures that will be produced. Each individual LED semiconductor structure is beneficially a square about 200 microns wide. The trenches 130 are beneficially narrower than about 10 microns (preferably close to 1 micron) and extend deeper than about 5 microns into the sapphire substrate 122. The trenches 130 assist a subsequent chip separation process.

Because of the hardness of sapphire and GaN, the trenches 130 are beneficially formed in the structure of FIG. 3 using reactive ion etching, preferably inductively coupled plasma reactive ion etching (ICP RIE). Forming trenches using ICP RIE has two main steps: forming scribe lines and etching. Scribe lines are formed on the structure of FIG. 3 using a photo-resist pattern in which areas of the sapphire substrate 122 where the trenches 130 are to be formed are exposed. The exposed areas are the scribe lines, while all other areas are covered by photo-resist. The photo-resist pattern is beneficially fabricated from a relatively hard photo-resist material that withstands intense plasma. For example, the photo-resist could be AZ 9260, while the developer used to develop the photo-resist to form the scribe lines could be AZ MIF 500.

In the illustrated example, the photo-resist is beneficially spin coated to a thickness of about 10 microns. However, in general, the photo-resist thickness should be about the same as the thickness of the vertical topology GaN-based LED layer structure plus the etch depth into the sapphire substrate 122. This helps ensure that the photo-resist mask remains intact during etching. Because it is difficult to form a thick photo-resist coating in one step, the photo-resist can be applied in two coats, each about 5 microns thick. The first photo-resist coat is spin coated on and then soft baked, for example, at 90° F. for about 15 minutes. Then, the second photo-resist coat is applied in a similar manner, but is soft baked, for example, at 110° F. for about 8 minutes. The photo-resist coating is then patterned to form the scribe lines. This is beneficially performed using lithographic techniques and development. Development takes a relatively long time because of the thickness of the photo-resist coating. After development, the photo-resist pattern is hard baked, for example, at about 80° F. for about 30 minutes. Then, the hard baked photo-resist is beneficially dipped in a MCB (Metal Chlorobenzene) treatment for about 3.5 minutes. Such dipping further hardens the photo-resist.

Figure 5:
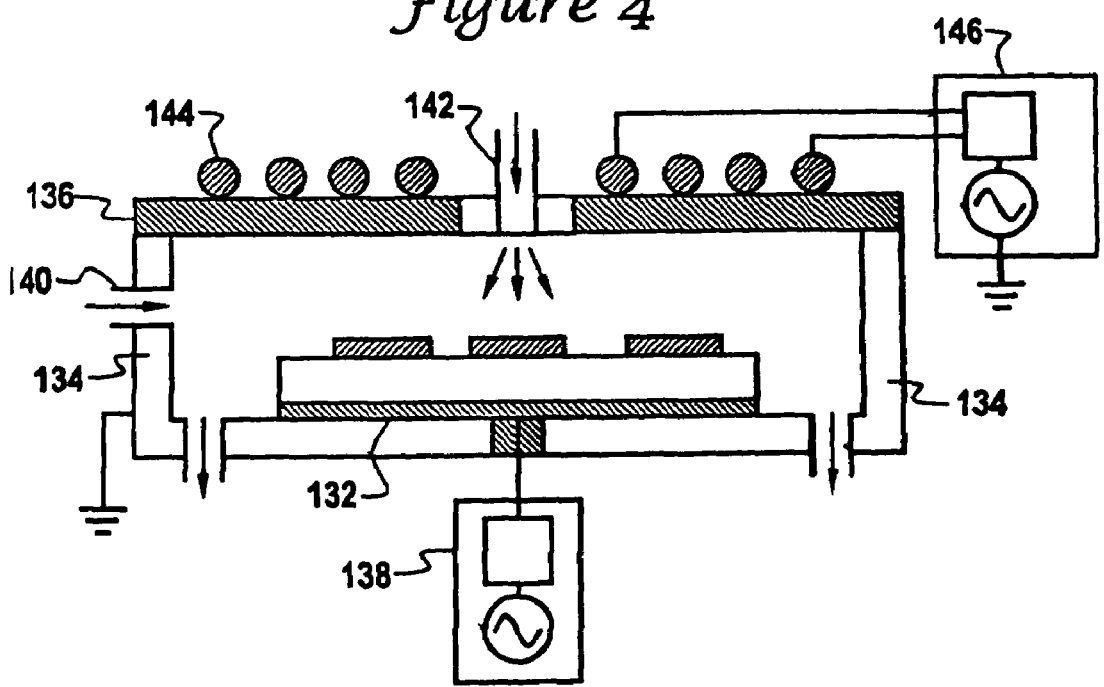

After the scribe lines are defined, the structure of FIG. 3 is etched. Referring now to FIG. 5, the ICP RIE etch process is performed by placing the structure of FIG. 3 on a bottom electrode 132 in a RIE chamber 134 having an insulating window 136 (beneficially a 1 cm-thick quartz window). The bottom electrode 132 is connected to a bias voltage supply 138 that biases the structure of FIG. 3 to enable etching. The bias voltage supply 138 beneficially supplies 13.56 MHz RF power and a DC-bias voltage. The distance from the insulating window 136 to the bottom electrode 132 is beneficially about 6.5 cm. A gas mixture of $Cl_2$ and $BCl_3$, and possibly Ar, is injected into the RIE chamber 134 through a reactive gas port 140. Furthermore, electrons are injected into the chamber via a port 142. A 2.5-turn or so spiral Cu coil 144 is located above the insulating window 136. Radio frequency (RF) power at 13.56 MHz is applied to the coil 144 from an RF source 146. It should be noted that magnetic fields are produced at right angles to the insulating window 136 by the RF power.

Still referring to FIG. 5, electrons present in the electromagnetic field produced by the coil 144 collide with neutral particles of the injected gases, resulting in the formation of ions and neutrals, which produce plasma. Ions in the plasma are accelerated toward the structure of FIG. 3 by the bias voltage applied by the bias voltage supply 138 to the bottom electrode 132. The accelerated ions pass through the scribe lines, forming the etch channels 130 (see FIG. 4).

Figure 6:
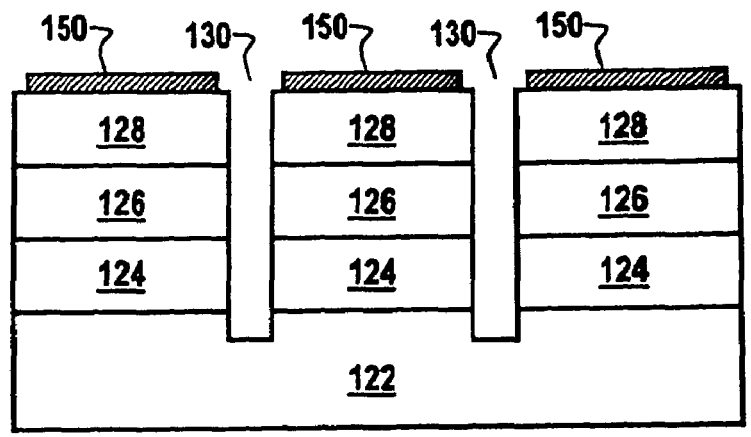

Referring now to FIG. 6, after the trenches 130 are formed, thin p-contacts 150 are formed on the individual LED semiconductor structures of the GaN-based LED layer structure. Those contacts 150 are beneficially comprised of Pt/Au, Pd/Au, Ru/Au, Ni/Au, Cr/Au, or of indium tin oxide (ITO)/Au and are less then 10 nm. Such contacts can be formed using a vacuum evaporator (electron beam, thermal, sputter), followed by thermal annealing at an intermediate temperature (approximately 300-700° C.).

Figure 7:
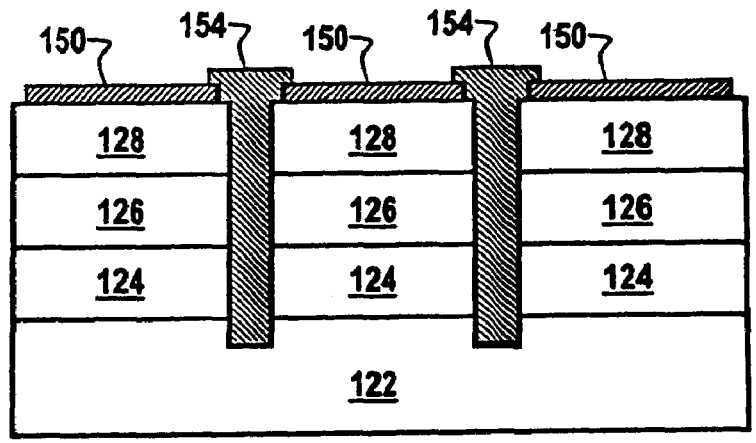

As shown in FIG. 7, after the contacts 150 are formed, the trenches 130 are filled with an easily removed material (beneficially a photo-resist) to form posts 154.

Figure 8:
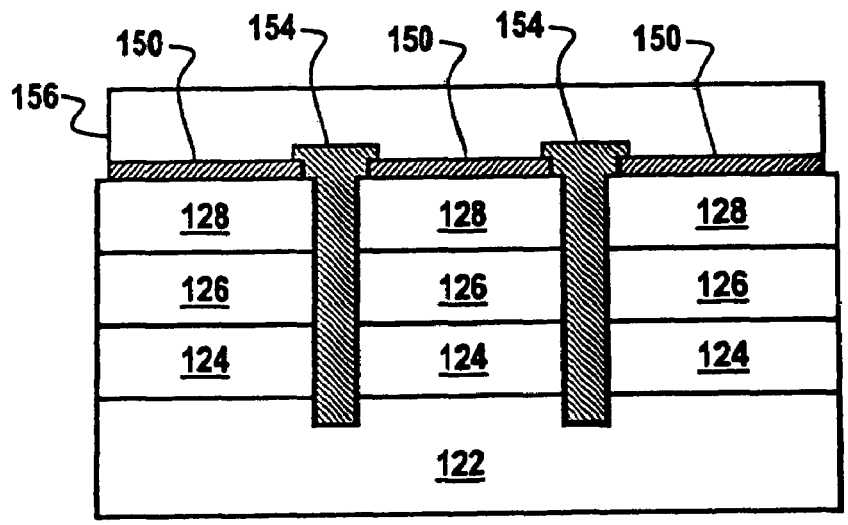

Referring now to FIG. 8, after the posts 154 are formed, a metal support layer 156 approximately 50 μm is formed over the posts 154 and over the p-contacts 150. The posts 154 prevent the metal that forms the metal support layer 156 from entering into the trenches. The metal support layer 156 is beneficially comprised of a metal having good electrical and thermal conductivity and that is easily formed, such as by electroplating, by electro-less plating, by CVD, or by sputtering. Before electroplating or electro-less plating, it is beneficial to coat the surface with a suitable metal, such as by sputtering. For example, the metal support layer 156 can be Cu, Cr, Ni, Au, Ag, Mo, Pt, Pd, W, or Al. Alternatively, the metal support layer 156 can be comprised of a metal-containing material such as titanium nitride.

Figure 9:
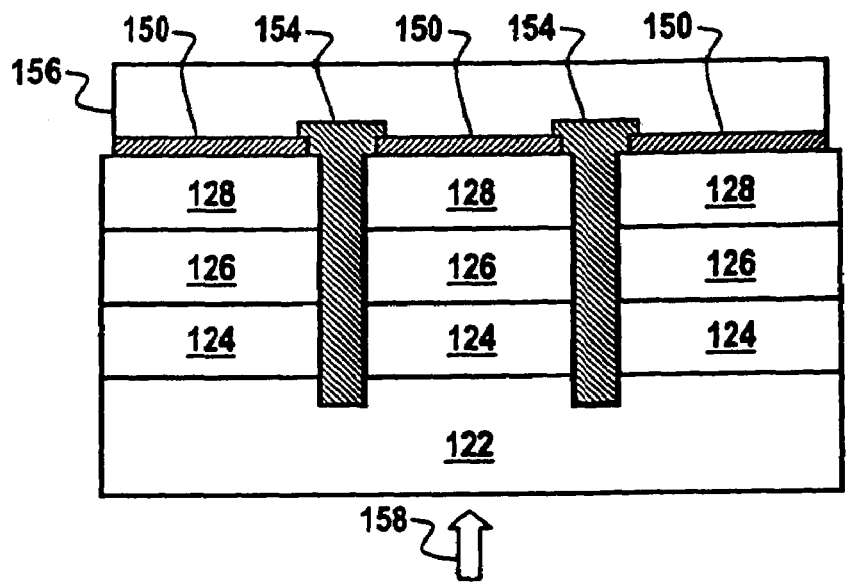

Turning now to FIG. 9, the sapphire substrate 122 is then removed from the remainder of the structure using light 158 from an eximer layer (having a wavelength less than 350 nanometers), while the sapphire substrate is biased away from the remainder of the structure (such as by use of vacuum chucks). The laser beam 158 passes through the sapphire substrate 122, causing localized heating at the junction of the sapphire substrate 122 and the n-GaN buffer layer 124. That heat decomposes the GaN at the interface of the sapphire substrate, which, together with the bias, causes the sapphire substrate 122 to separate, reference FIG. 10. It is beneficial to hold the other side of the structure with a vacuum chuck during laser lift off. This enable easy application of a separation bias.

Laser lift off processes are described in U.S. Pat. No. 6,071,795 to Cheung et al., entitled, "Separation of Thin Films From Transparent Substrates By Selective Optical Processing," issued on Jun. 6, 2000, and in Kelly et al. "Optical process for liftoff of group III-nitride films", Physica Status Solidi (a) vol. 159, 1997, pp. R3-R4. Beneficially, the metal support layer 156 fully supports the individual LED semiconductor structures during and after separation of the sapphire substrate.

Figure 10:
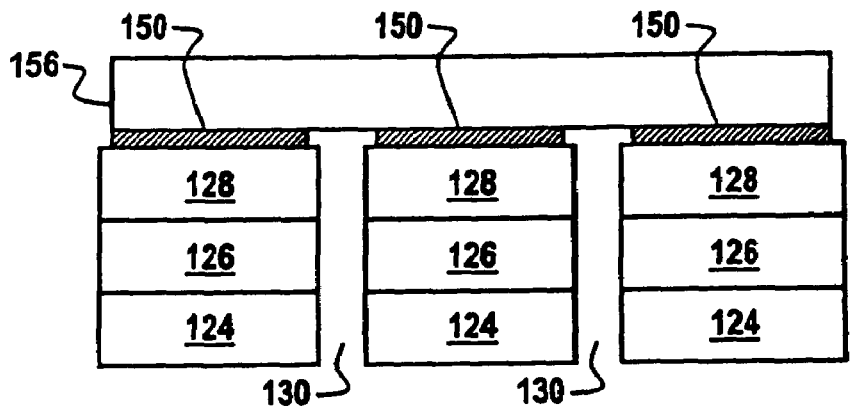

Still referring to FIG. 10, the posts 154 are then removed, leaving the trenches 130 behind.

Figure 11:
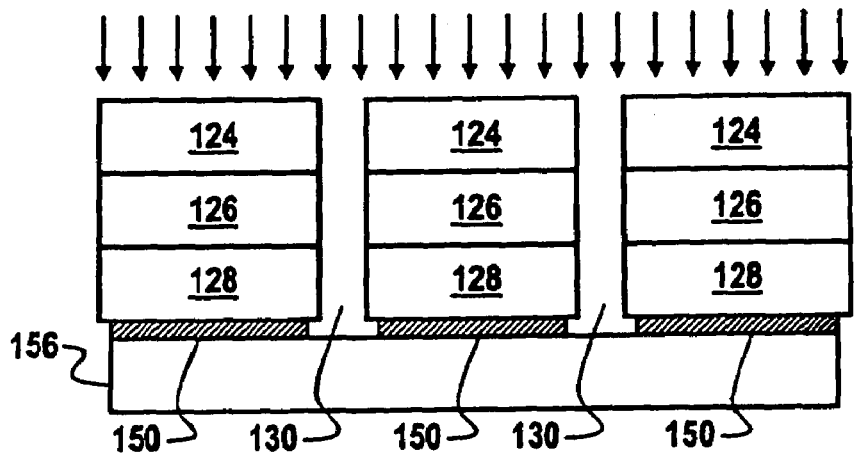

Turning now to FIG. 11, the structure of FIG. 10 is inverted. Then, the side opposite the metal support layer 156 is cleaned with HCl to remove Ga droplets (laser beam 158 heating separates GaN into Ga+N). After cleaning, ICP RIE polishing (using $Cl_2$ an/or $Cl_2+BCl_3$) is performed to smooth the exposed surface (which is rough due to the separation of the sapphire substrate). Polishing produces an atomically flat surface of pure n-GaN on the n-GaN buffer layer 124.

Figure 12:
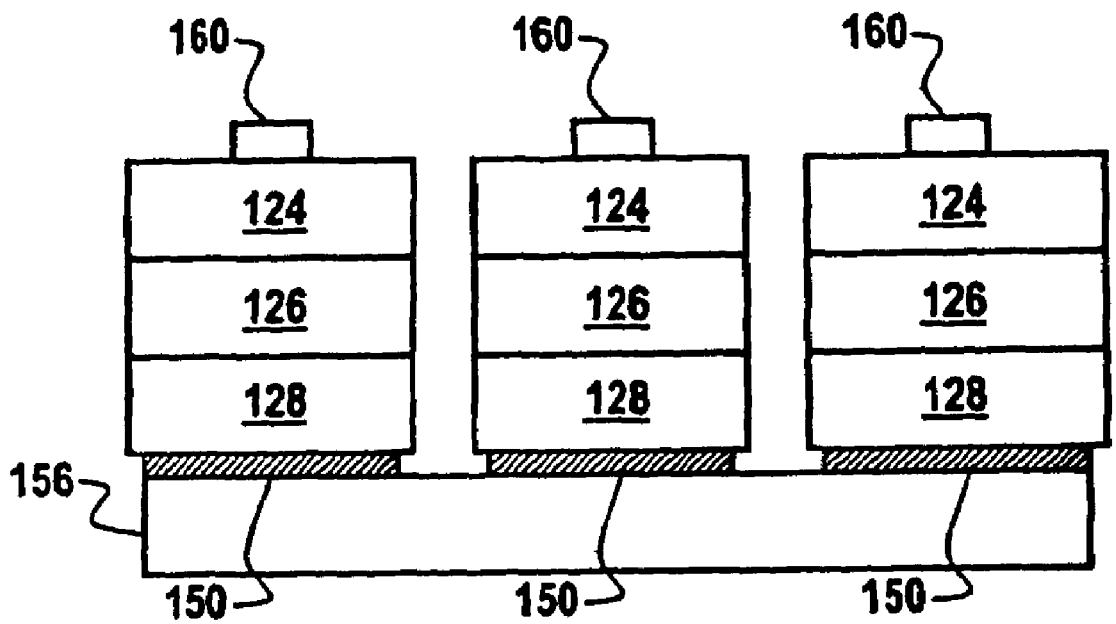

Turning now to FIG. 12, n-type ohmic contacts 160 are formed on the n-GaN buffer layer 124 using normal semiconductor-processing techniques. Beneficially, the n-type ohmic contacts 160 are comprised of Ti/Al-related materials.

Figure 13:
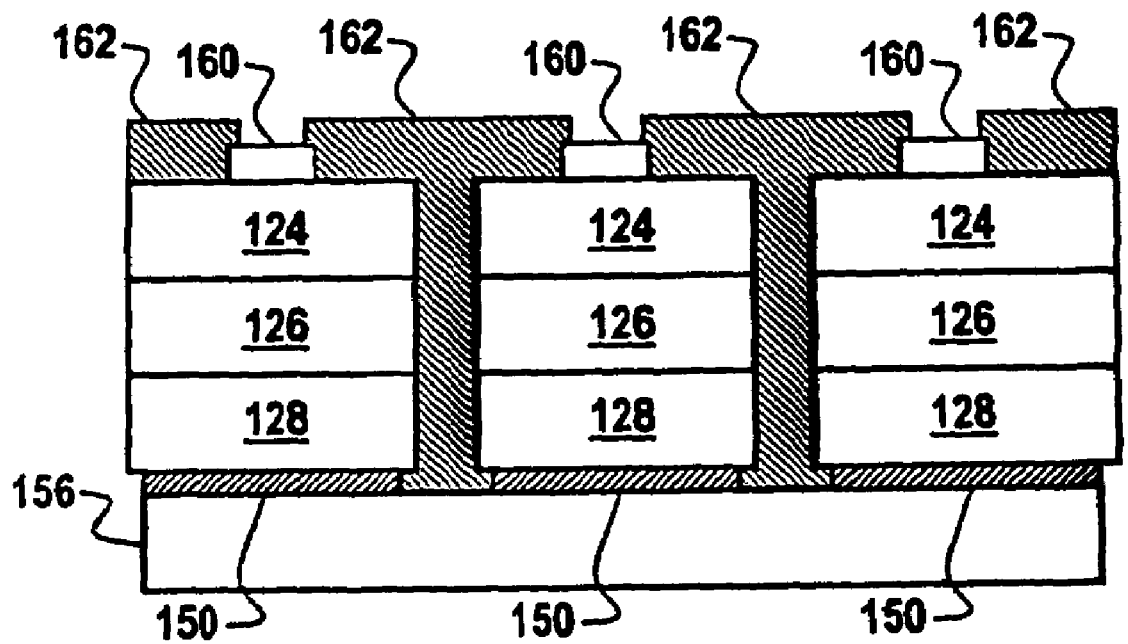

Turning now to FIG. 13, to protect the semiconductor layers from subsequent processing, a passivation layer 162 is formed on the n-type ohmic contacts 160 and in the trenches 130. Electrical insulation comprised of $SiO_2$ or $Si_3N_4$ are suitable passivation layer materials. Additionally, as shown, the passivation layer 162 is patterned to expose top surface portions of the n-type ohmic contacts 160.

Figure 14:
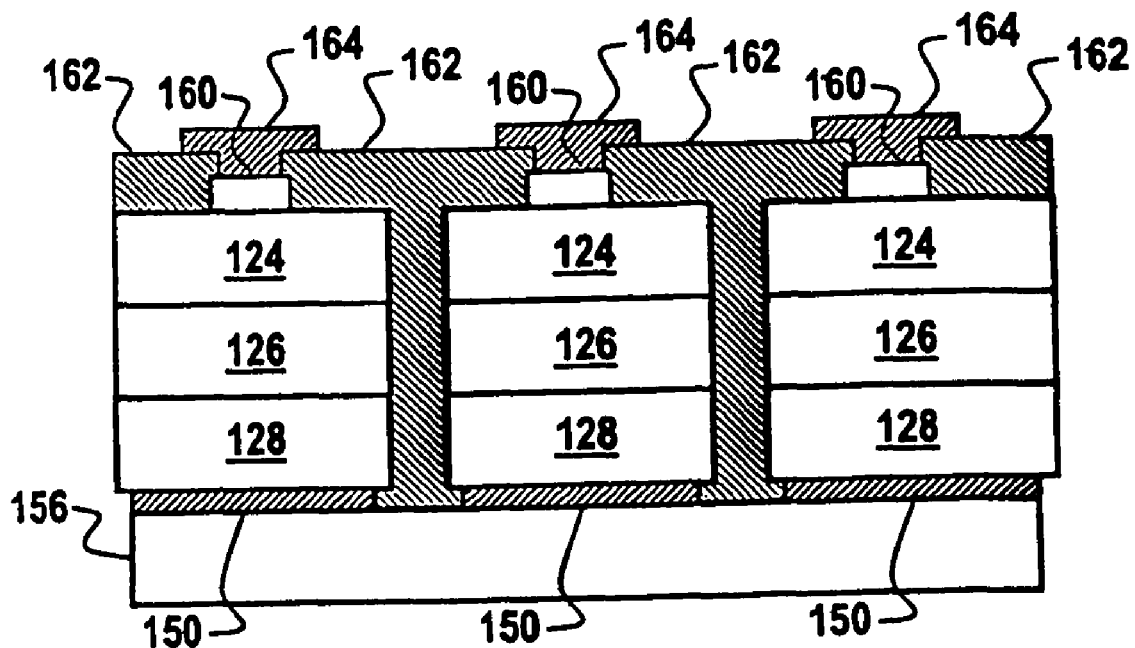

Turning now to FIG. 14, after the passivation layer 162 is formed, metal pads 164 are formed on the n-type ohmic contacts 160. As shown in FIG. 14, the metal pads 164 extend over portions of the passivation layer 162. The metal pads 164 are beneficially comprised of Cr and Au.

Figure 15:
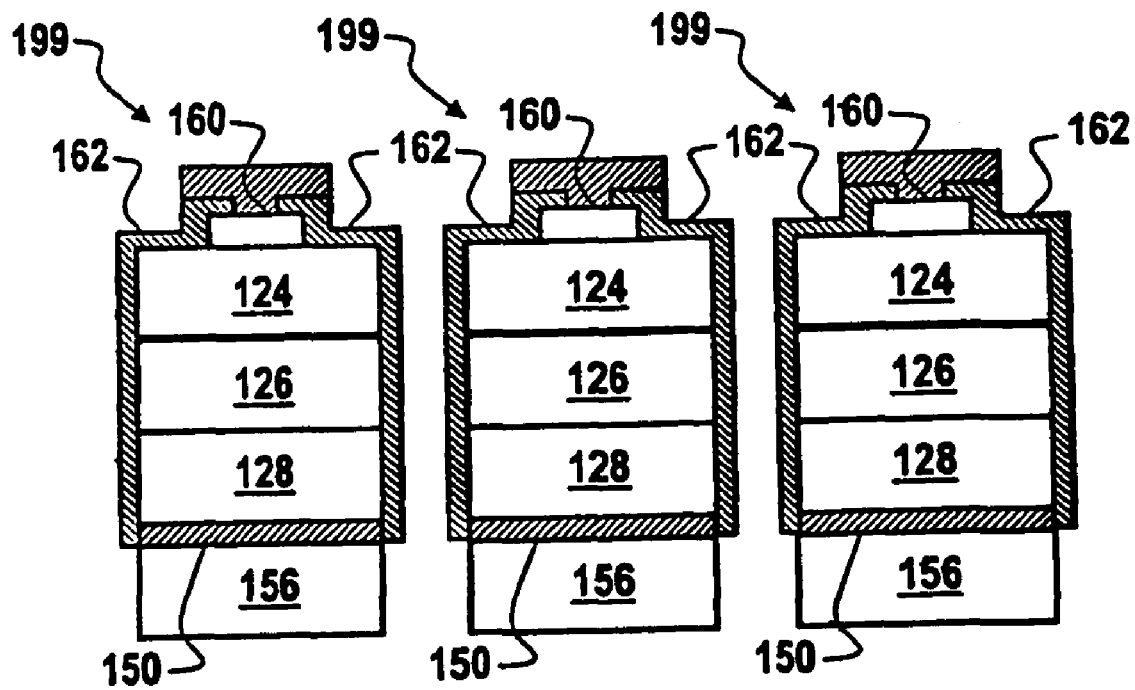

After the metal pads 164 are formed, individual devices can be diced out. Referring now to FIG. 15, dicing is beneficially accomplished using photo lithographic techniques to etch through the metal support layer 156 to the bottom of the passivation layer 162 (at the bottom of the trenches 130) and by removal of the passivation layer 162. Alternatively, sawing can be used. In practice, it is probably better to perform sawing at less than about 0° C. The result is a plurality of vertical topology GaN LEDs 199 on conductive substrates.

The foregoing has described forming trenches 130 before laser lift off of the sapphire substrate 122. However, this is not required. The sapphire substrate 122 could be removed first, and then trenches 130 can be formed.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A vertical light-emitting device, comprising:
   a conductive support structure;
   a first electrode over the conductive support structure;
   a semiconductor structure over the first electrode, the semiconductor structure including a first-type semiconductor layer over the first electrode, an active layer over the first-type semiconductor layer and a second-type semiconductor layer over the active layer;
   a passivation layer contacting at least the first-type semiconductor layer of the semiconductor structure, wherein the portion of the passivation layer that contacts the first-type semiconductor layer is located above at least a portion of the upper surface of the conductive support structure; and
   a second electrode over the semiconductor structure, wherein the first electrode and the second electrode are respectively located at opposite sides of the semiconductor structure.

2. The vertical light-emitting device according to claim 1, further comprising a metallic pad over the second electrode.

3. The vertical light-emitting device according to claim 1, wherein the passivation layer is positioned such that the passivation layer is located on a part of the second electrode.

4. The vertical light-emitting device according to claim 1, wherein the passivation layer comprises material including at least one of Si, O, and N.

5. The vertical light-emitting device according to claim 1, wherein the conductive support structure comprises a metal layer.

6. The vertical light-emitting device according to claim 5, wherein the metal layer is a metal support layer.

7. The vertical light-emitting device according to claim 5, wherein the metal layer comprises a metal selected from a group including Cu, Cr, Ni, Au, Ag, Mo, Pt, Pd, W, and Al.

8. The vertical light-emitting device according to claim 1, wherein the passivation layer is disposed higher than the second electrode.

9. The vertical light-emitting device according to claim 1, further comprising a metal coating disposed between the conductive support structure and the first electrode.

10. The vertical light-emitting device according to claim 1, wherein the first-type semiconductor layer is a p-type layer and the second-type semiconductor layer is an n-type layer.

11. The vertical light-emitting device according to claim 1, wherein the passivation layer located adjacent to the second-type semiconductor layer extends to at least an upper surface of the conductive support structure.

12. The vertical light-emitting device according to claim 1, wherein the conductive support structure comprises at least one metal structure.

13. The vertical light-emitting device according to claim 1, wherein the second electrode contacts a light emitting surface of the semiconductor structure.

14. The vertical light-emitting device according to claim 13, wherein the passivation layer contacts at least a part of the light emitting surface of the semiconductor structure.

15. The vertical light-emitting device according to claim 14, wherein the first electrode contacts the semiconductor structure, and wherein the contact area between the first electrode and the semiconductor structure is greater than the contact area between the passivation layer and the light emitting surface of the semiconductor structure.

16. The vertical light-emitting device according to claim 14, wherein the passivation layer extends along the light emitting surface of the semiconductor structure in the direction of the second electrode.

17. The vertical light-emitting device according to claim 16, wherein the passivation layer extends along the light emitting surface of the semiconductor structure and is in contact with the second electrode.

18. The vertical light-emitting device according to claim 1, wherein the first electrode has a first surface facing the semiconductor structure and the second electrode has a second surface facing the semiconductor structure, and wherein the area of the first surface is different from the area of the second surface.

19. The vertical light-emitting device according to claim 1, wherein the first electrode contacts a portion of the first-type semiconductor layer.

20. The vertical light-emitting device according to claim 1, wherein the first electrode contacts the first-type semiconductor layer, and the first-type semiconductor layer has a surface facing the first electrode, and wherein the contact area between the first electrode and the first-type semiconductor layer is smaller than the entire area of the surface of the first-type semiconductor layer.

21. The vertical light-emitting device according to claim 1, wherein the semiconductor structure is less than about 5 microns thick.

22. The vertical light-emitting device according to claim 1, wherein the passivation layer covers the entire side surface of the first electrode.

23. The vertical light-emitting device according to claim 1, wherein the passivation layer contacts at least two side surfaces of the first electrode.

24. The vertical light-emitting device according to claim 1, wherein the passivation layer contacts the first electrode.

25. The vertical light-emitting device according to claim 1, wherein the conductive support structure comprises a support layer.

26. The vertical light-emitting device according to claim 1, wherein the first electrode is located between the conductive support structure and the semiconductor structure, and wherein the portion of the passivation layer that contacts the first-type semiconductor layer is located above the first electrode.

27. The vertical light-emitting device according to claim 1, wherein the semiconductor structure comprises a side surface, and wherein the passivation layer covers the entire side surface of the semiconductor structure.

28. A vertical light-emitting device, comprising:
   a conductive support structure;
   a first-type semiconductor layer over the conductive support structure;
   a first electrode disposed between the conductive support structure and the first-type semiconductor layer such that first-type semiconductor layer is over the first electrode;
   a second-type semiconductor layer over the first-type semiconductor layer;
   a light emitting layer disposed between the first-type semiconductor layer and the second-type semiconductor layer;
   a passivation layer contacting at least one of the first-type semiconductor layer, the light emitting layer, the second-type semiconductor layer and the first electrode, wherein the portion of the passivation layer contacting the first-type semiconductor layer is located above at least a portion of the conductive support structure; and
   a second electrode over the second-type semiconductor layer.

29. The vertical light-emitting device according to claim 28, wherein the first-type semiconductor layer is a p-GaN based layer and the second-type semiconductor layer is an n-GaN based layer.

30. The vertical light-emitting device according to claim 28, wherein the passivation layer covers a side portion of the first-type semiconductor layer, the light emitting layer and the second-type semiconductor layer.

31. The vertical light-emitting device according to claim 28, wherein the passivation layer comprises material including at least one of Si, O, and N.

32. The vertical light-emitting device according to claim 28, wherein the conductive support structure comprises metallic material.

33. The vertical light-emitting device according to claim 28, wherein the conductive support structure comprises a metal selected from a group including Cu, Cr, Ni, Au, Ag, Mo, Pt, Pd, W, and Al.

34. The vertical light-emitting device according to claim 28, wherein the passivation layer located adjacent to the second-type semiconductor layer extends to at least an upper level of the conductive support structure.

35. The vertical light-emitting device according to claim 28, wherein the conductive support structure comprises at least one metal structure.

36. The vertical light-emitting device according to claim 28, further comprising a metal coating disposed between the conductive support structure and the first electrode.

37. The vertical light-emitting device according to claim 28, wherein the conductive support structure comprises a metal layer.

38. The vertical light-emitting device according to claim 37, wherein the metal layer is a metal support layer.

39. The vertical light-emitting device according to claim 28, wherein the first electrode has a first surface facing the first-type semiconductor layer and the second electrode has a second surface facing the second-type semiconductor layer, and wherein the area of the first surface is different from the area of the second surface.

40. The vertical light-emitting device according to claim 28, wherein the first electrode contacts a portion of the first-type semiconductor layer.

41. The vertical light-emitting device according to claim 28, wherein the first electrode contacts the first-type semiconductor layer, and the first-type semiconductor layer has a surface facing the first electrode, and wherein the contact area between the first electrode and the first-type semiconductor layer is smaller than the entire area of the surface of the first-type semiconductor layer.

42. The vertical light-emitting device according to claim 28, wherein the thickness of the semiconductor layers including the first-type semiconductor layer, the light emitting layer and the second-type semiconductor layer is less than about 5 microns.

43. The vertical light-emitting device according to claim 28, wherein the passivation layer covers the entire side surface of the first electrode.

44. The vertical light-emitting device according to claim 28, wherein the passivation layer contacts at least two side surfaces of the first electrode.

45. The vertical light-emitting device according to claim 28, wherein the passivation layer contacts the first electrode.

46. The vertical light-emitting device according to claim 28, wherein the conductive support structure comprises a support layer.

47. The vertical light-emitting device according to claim 28, wherein the first electrode is located between the conductive support structure and the first-type semiconductor layer, wherein the passivation layer contacts the first-type semiconductor layer, and wherein the portion of the passivation layer that contacts the first-type semiconductor layer is located above the first electrode.

48. A vertical light-emitting device, comprising:
a conductive support structure;
a p-type GaN-based layer over the conductive support structure;
a first electrode disposed between the conductive support structure and the p-type GaN-based layer such that p-type GaN-based layer is disposed over the first electrode;
an n-type GaN-based layer over the p-type GaN-based layer;
a light emitting layer disposed between the p-type GaN-based layer and the n-type GaN-based layer;
a passivation layer contacting at least one of the p-type GaN-based layer, the light emitting layer, the n-type GaN-based layer and the first electrode;
a second electrode over the n-type GaN-based layer, wherein the contact area between the passivation layer and the n-type GaN-based layer is greater than the contact area between the passivation layer and the p-type GaN-based layer.

49. The vertical light-emitting device according to claim 48, wherein the passivation layer is disposed partially between the conductive support structure and the p-type GaN-based layer.

50. The vertical light-emitting device according to claim 48, the passivation layer is over an upper surface of the n-type GaN-based layer.

51. The vertical light-emitting device according to claim 48, wherein the passivation layer is in contact with at least one surface of the second electrode.

52. The vertical light-emitting device according to claim 48, wherein the first electrode comprises at least two layers including a first layer and a second layer, wherein the first layer and the second layer include different materials.

53. The vertical light-emitting device according to claim 52, wherein one of the first layer and the second layer includes a transparent conductive material.

54. The vertical light-emitting device according to claim 48, further comprising a metal coating disposed between the conductive support structure and the first electrode.

55. The vertical light-emitting device according to claim 48, wherein the conductive support structure comprises a metal support layer.

56. The vertical light-emitting device according to claim 48, wherein the first electrode has a first surface facing the p-type GaN-based layer and the second electrode has a second surface facing the n-type GaN-based layer, and wherein the area of the first surface is different from the area of the second surface.

57. The vertical light-emitting device according to claim 48, wherein the first electrode contacts a portion of the p-type GaN-based layer.

58. The vertical light-emitting device according to claim 48, wherein the first electrode contacts the p-type GaN-based layer, and the p-type GaN-based layer has a surface facing the first electrode, and wherein the contact area between the first electrode and the p-type GaN-based layer is smaller than the entire area of the surface of the p-type GaN-based layer.

59. The vertical light-emitting device according to claim 48, wherein the thickness of the semiconductor layers including the p-type GaN-based layer, the light emitting layer and the n-type GaN-based layer is less than about 5 microns.

60. The vertical light-emitting device according to claim 48, wherein the passivation layer covers the entire side surface of the first electrode.

61. The vertical light-emitting device according to claim 48, wherein the passivation layer contacts at least two side surfaces of the first electrode.

62. The vertical light-emitting device according to claim 48, wherein the passivation layer contacts the first electrode.

63. The vertical light-emitting device according to claim 48, wherein the conductive support structure comprises a support layer.

64. A vertical light-emitting device, comprising:
a conductive support structure;
a first electrode over the conductive support structure;
a semiconductor structure over the first electrode, the semiconductor structure including a first-type semiconductor layer over the first electrode, an active layer over the first-type semiconductor layer and a second-type semiconductor layer over the active layer;
a passivation layer contacting the semiconductor structure; and
a second electrode over the semiconductor structure, wherein the first electrode and the second electrode are respectively located at opposite sides of the semiconductor structure, and wherein a metal coating is disposed between the conductive support structure and the first electrode.

65. The vertical light-emitting device according to claim 64, wherein the metal coating is in contact with the first electrode.

66. The vertical light-emitting device according to claim 64, wherein the metal coating is in contact with the conductive support structure.

67. The vertical light-emitting device according to claim 64, wherein the metal coating is in contact with the passivation layer.

68. The vertical light-emitting device according to claim 64, wherein the conductive support structure comprises a metal layer.

69. The vertical light-emitting device according to claim 68, wherein the metal layer comprises a metal selected from a group including Cu, Cr, Ni, Au, Ag, Mo, Pt, Pd, W, and Al.

70. The vertical light-emitting device according to claim 64, wherein the conductive support structure comprises a metal support layer.

71. The vertical light-emitting device according to claim 64, wherein the passivation layer further contacts the first electrode.

72. The vertical light-emitting device according to claim 64, wherein the first electrode has a first surface facing the semiconductor structure and the second electrode has a second surface facing the semiconductor structure, and wherein the area of the first surface is different from the area of the second surface.

73. The vertical light-emitting device according to claim 64, wherein the first electrode contacts a portion of the first-type semiconductor layer.

74. The vertical light-emitting device according to claim 64, wherein the first electrode contacts the first-type semiconductor layer, and the first-type semiconductor layer has a surface facing the first electrode, and wherein the contact area between the first electrode and the first-type semiconductor layer is smaller than the entire area of the surface of the first-type semiconductor layer.

75. The vertical light-emitting device according to claim 64, wherein the semiconductor structure is less than about 5 microns thick.

76. The vertical light-emitting device according to claim 64, wherein the passivation layer covers the entire side surface of the first electrode.

77. The vertical light-emitting device according to claim 64, wherein the passivation layer contacts at least two side surfaces of the first electrode.

78. The vertical light-emitting device according to claim 64, wherein the conductive support structure comprises a support layer.

* * * * *